US012631689B2

(12) United States Patent
Duan et al.

(10) Patent No.: US 12,631,689 B2
(45) Date of Patent: May 19, 2026

(54) METHOD AND SYSTEM FOR EVALUATING POWER BATTERY AGING STATE AND SCREENING RETIREMENT

(71) Applicant: SHANDONG UNIVERSITY, Jinan (CN)

(72) Inventors: Bin Duan, Jinan (CN); Peng Huang, Jinan (CN); Chenghui Zhang, Jinan (CN); Yongzhe Kang, Jinan (CN); Yunlong Shang, Jinan (CN)

(73) Assignee: SHANDONG UNIVERSITY, Jinan (CN)

( * ) Notice: Subject to any disclaimer, the term of this patent is extended or adjusted under 35 U.S.C. 154(b) by 399 days.

(21) Appl. No.: 18/038,259

(22) PCT Filed: Oct. 17, 2022

(86) PCT No.: PCT/CN2022/125720
§ 371 (c)(1),
(2) Date: May 23, 2023

(87) PCT Pub. No.: WO2024/036737
PCT Pub. Date: Feb. 22, 2024

(65) Prior Publication Data
US 2024/0369642 A1 Nov. 7, 2024

(30) Foreign Application Priority Data

Aug. 17, 2022 (CN) .......................... 202210985717.0

(51) Int. Cl.
*G01R 31/392* (2019.01)
*G01R 31/367* (2019.01)
(Continued)

(52) U.S. Cl.
CPC ......... *G01R 31/392* (2019.01); *G01R 31/367* (2019.01); *G01R 31/3828* (2019.01); *G01R 31/3842* (2019.01); *G01R 31/389* (2019.01)

(58) Field of Classification Search
CPC ............... G01R 31/392; G01R 31/367; G01R 31/3828; G01R 31/3842; G01R 31/389; G01R 31/36; G01R 31/378
See application file for complete search history.

(56) References Cited

U.S. PATENT DOCUMENTS

2015/0066406 A1    3/2015  Sun et al.
2016/0061908 A1*   3/2016  Torai .................. G01R 31/3648
                                                        702/63

FOREIGN PATENT DOCUMENTS

CN          108993931 A     12/2018
CN          109768340 A     5/2019
                    (Continued)

OTHER PUBLICATIONS

CN-114833097-B_translated (Year: 2024).*
(Continued)

*Primary Examiner* — Catherine T. Rastovski
*Assistant Examiner* — Michael J Singletary
(74) *Attorney, Agent, or Firm* — Oliff PLC

(57) ABSTRACT

A method and system for evaluating power battery aging state and screening retirement, wherein the method includes: performing first-level screening according to appearance and voltage data of a power battery; obtaining charging test data in a set time of the power battery subjected to the first-level screening, performing derivation and secondary derivation based on a capacity-voltage curve of the battery, respectively extracting a first index and a second index of a set peak of the derivated curve, and respectively using the first index and the second index to determine a battery category and consistency, thereby realizing second-level (Continued)

screening; and performing third-level screening on the battery subjected to the second-level screening based on a direct current internal resistance of the battery. By using the method and system, the detection time can be effectively reduced, the screening test cost can be reduced and the evaluation and screening precision can be improved.

9 Claims, 7 Drawing Sheets

(51) Int. Cl.
    *G01R 31/3828*     (2019.01)
    *G01R 31/3842*     (2019.01)
    *G01R 31/389*     (2019.01)

(56)            References Cited

FOREIGN PATENT DOCUMENTS

| CN | 109800446 A | 5/2019 | | |
| CN | 111487532 A | 8/2020 | | |
| CN | 111974709 A | 11/2020 | | |
| CN | 114487887 A | 5/2022 | | |
| CN | 111974709 B | * 6/2022 | ............. | B07C 5/344 |
| CN | 113900028 B | * 7/2022 | .......... | G01R 31/392 |
| CN | 115166563 A | 10/2022 | | |
| CN | 109800446 B | * 5/2023 | | |
| CN | 114833097 B | * 1/2024 | ............. | B07C 5/344 |

OTHER PUBLICATIONS

CN-109800446-B_translated (Year: 2023).*
CN-113900028-B_translated (Year: 2022).*
CN-111974709-B_translated (Year: 2022).*
Feb. 22, 2023 Search Report issued in International Patent Application No. PCT/CN2022/125720.
Feb. 22, 2023 Written Opinion of the International Searching Authority issued in International Patent Application No. PCT/CN2022/125720.

* cited by examiner

METHOD AND SYSTEM FOR EVALUATING POWER BATTERY AGING STATE AND SCREENING RETIREMENT

CROSS-REFERENCE TO RELATED APPLICATIONS

The present invention claims priority to Chinese Patent Application No. 202210985717.0 filed on Aug. 17, 2022 to the China National Intellectual Property Administration, entitled "METHOD AND SYSTEM FOR EVALUATING POWER BATTERY AGING STATE AND SCREENING RETIREMENT", the disclosure of which is incorporated herein by reference in its entirety.

TECHNICAL FIELD

The present invention belongs to the technical field of battery evaluation and screening, and relates to a method and system for evaluating power battery aging state and screening retirement.

BACKGROUND

The description in this section merely provides background information related to the present invention and does not necessarily constitute the prior art.

Power batteries are the "hearts" of electric vehicles and new energy storage systems. Lithium ion batteries are especially widely used because of high energy density, long cycle life and high reliability. However, with continuous aging of the power batteries, the performance thereof will gradually decline. Battery capacity is the most direct parameter that reflects the aging state of the battery. When the battery capacity is less than 80% of the rated capacity, its performance will not be able to meet the application requirements of electric vehicles, but the battery still has high residual capacity and economic value, so it is unreasonable to discard the retired batteries of the electric vehicles directly, and cascade utilization or secondary utilization of the retired batteries of the electric vehicles has become an inevitable trend and attracted wide attention. Battery cascade utilization can be applied to different scenarios according to actual demand, such as new energy storage systems, low-speed electric vehicles, and electric bicycles, among which the application in the new energy storage systems is mainly used for solving new energy consumption and supporting the stable development of new energy. To sum up, it is necessary to comprehensively consider multiple factors such as application scenarios, economy and environment from the manufacturing to the cascade utilization of power batteries to complete state detection and evaluation.

In fact, the internal performance differences of power batteries are mainly manifested in internal resistance and maximum available capacity. Accordingly, the current screening methods for power batteries are mainly divided into two categories: the first category is a direct measurement method. Firstly, the battery integrity can be simply determined by observing the appearance features of the battery; and then voltage data is obtained through charging and discharging tests, and classification and screening are conducted by voltage values. This method has good accuracy, but the whole test process is complex, time-consuming and cumbersome, and the economy is poor, so it is difficult to apply on a large scale. The other category of screening method is to utilize relevant features of capacity and internal resistance for classification. However, the commonly used methods have poor adaptability and cannot meet the requirements of numerous varieties and large characteristic differences of batteries, including LiNCM and LiFePO$_4$.

The Chinese Invention Patent Application (application No. 202010273168.5) provided a screening method which takes five battery parameters: direct current internal resistance RDC, coulombic efficiency CE, capacity retention SOH, temperature rise $\Delta$T, and voltage increment $\Delta$V as indexes. This screening method has problems such as a long acquisition cycle of multi-parameter features and lack of practical verification. The Chinese Invention Patent Application (202010610610.9) carried out multi-level screening by measured battery capacity, internal resistance and temperature, but the test time of the whole screening process is too long, especially that the acquisition of the capacity index requires a complete charging process, and the acquisition of the temperature parameter will increase the cost of the screening process.

There is an obvious mapping relationship between the peak of the incremental capacity curve of the battery and the aging of the battery, which has been widely studied in battery capacity estimation. Generally, multiple battery peaks are used as the capacity indexes, and the estimation effect is good. However, the multiple peaks will cause the problem that the battery charging time is too long, and the capacity estimation effect under one peak is often not ideal.

SUMMARY

In order to solve the above problems, the present invention provides a method and system for evaluating power battery aging state and screening retirement, which can effectively reduce the detection time, reduce the screening test cost and improve the evaluation and screening precision.

In some embodiments, the present invention adopts the following technical solutions.

A method for evaluating power battery aging state and screening retirement, which is used for screening retired power batteries, and includes:

performing first-level screening according to appearance and voltage data of a power battery;

obtaining charging test data in a set time of the power battery subjected to the first-level screening, performing derivation and secondary derivation based on a capacity-voltage curve of the battery, respectively extracting a first index and a second index of a set peak of the derivated curve, and respectively using the first index and the second index to determine a battery category and consistency, thereby realizing second-level screening; and performing third-level screening on the battery subjected to the second-level screening based on a direct current internal resistance of the battery.

As an alternative implementation, the test data includes voltage and current data during a charging process of the power battery.

As an alternative implementation, the set time is greater than or equal to the time required for the power battery to be charged to show the first index and the second index.

As an alternative implementation, the specific process of the second-level screening includes: derivating the capacity-voltage curve of the battery to obtain an incremental capacity curve, extracting a first peak of the filtered incremental capacity curve as the first index, and determining the battery category by using the first index; and derivating the incremental capacity curve to obtain a new curve, extracting a first peak of the filtered new curve as the second index, determining consistency of batteries in each category by using the second index, and screening out the batteries of the same category with the consistency less than a set value.

As a further defined implementation, if an abscissa value of the first index is greater than a preset value, the battery is a ternary lithium battery, otherwise the battery is a lithium iron phosphate battery.

As a further defined implementation, a specific process of determining consistency of batteries in each category by using the second index includes determining the consistency of each category of batteries according to the second index by using at least one trained random forest model.

As a further defined implementation, a training process of the random forest model includes:

obtaining voltage and current data through charging a part of different categories of retired batteries, and obtaining a real capacity value of the retired battery by using an ampere-hour integral method;

extracting the first index and second index by using capacity-voltage data of a part of charging segments, determining the battery category through a coordinate position of the first index, forming different battery training sample sets respectively, and extracting a plurality of samples with replacement to serve as a training subset; and for the training subset, randomly extracting a plurality of features from a feature set without replacement to serve as the basis for splitting each node on a decision tree, generating a complete decision tree from top to bottom starting from a root node, repeating the process until a plurality of decision trees are obtained, and combining the decision trees to form the random forest model.

As an alternative solution, a process of obtaining the direct current internal resistance of the battery includes: for the lithium iron phosphate battery, after a charging task, discharging the battery to a first set voltage and then standing for a period of time, and calculating the direct current internal resistance of the battery according to the first set voltage and the voltage value after standing; and for the ternary battery, after obtaining a capacity feature, continuously charging the battery to a second set voltage and then standing for a period of time, and calculating the direct current internal resistance of the battery according to the second set voltage and the voltage value after standing.

A system for evaluating power battery aging state and screening retirement includes:

a first screening module, configured to perform first-level screening according to appearance and voltage data of a power battery;

a second screening module, configured to obtain charging test data in a set time of the power battery subjected to the first-level screening, perform derivation and secondary derivation based on a capacity-voltage curve of the battery, respectively extract a first index and a second index of a set peak of the derivated curve, and respectively use the first index and the second index to determine a battery category and consistency, thereby realizing second-level screening; and a third screening module, configured to perform third-level screening on the battery subjected to the second-level screening based on a direct current internal resistance of the battery.

Compared with the prior art, the present invention has the following beneficial effects.

According to the present invention, the first index and the second index are constructed, and the battery only needs to be charged until the first index and the second index are shown, so that the test time can be greatly shortened, the data required by the test can be reduced, and the screening speed of the retired batteries can be improved.

According to the present invention, the voltage and current data of the power battery can be obtained within a short time, and the aging performance evaluation of the battery can be processed quickly. The present invention has the characteristics of high speed, high precision and strong adaptability, and can be popularized and applied to the fields of retired battery screening and the like.

According to the present invention, the appearance basic data, the capacity characteristic indexes and the direct current internal resistance are respectively utilized to complete the multi-level screening of the retired batteries. A large number of experimental tests show that the evaluation and screening method provided by the present invention can effectively reduce the test time and meanwhile ensure high accuracy. The retired batteries with similar performance are regrouped and then subjected to a charging-discharging test, and compared with initial modules, it is found that the voltage consistency between the regrouped battery cells is significantly improved.

BRIEF DESCRIPTION OF THE DRAWINGS

The drawings constituting a part of the present invention are used for providing a further understanding of the present invention. The schematic embodiments of the present invention and descriptions thereof are used for explaining the present invention, and do not constitute an improper limitation of the present invention.

DETAILED DESCRIPTION

The present invention is further described below with reference to the drawings and embodiments.

It should be pointed out that the following detailed descriptions are all illustrative and are intended to provide further descriptions of the present invention. Unless otherwise specified, all technical and scientific terms used herein have the same meanings as those usually understood by a person of ordinary skill in the art to which the present invention belongs.

It should be noted that the terms used herein are merely used for describing specific implementations, and are not intended to limit exemplary implementations of the present invention. As used herein, the singular form is intended to include the plural form, unless the context clearly indicates otherwise. In addition, it should further be understood that terms "comprise" and/or "include" used in this specification indicate that there are features, steps, operations, devices, components, and/or combinations thereof.

Embodiment 1

Figure 1:
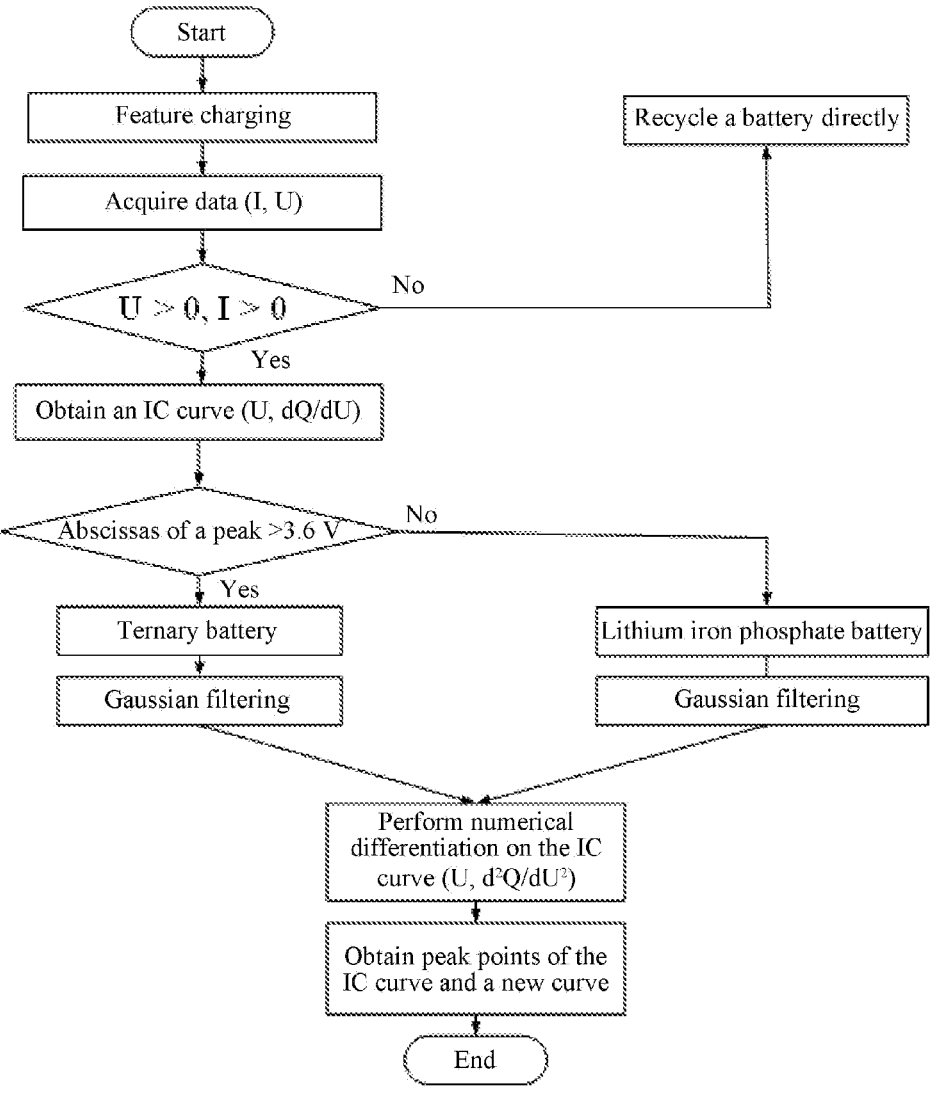
FIG. 1 is a process of obtaining new indexes for evaluating the aging state of a power battery.

Provided are a method for evaluating power battery aging state and a method for screening retirement thereof. A flow for obtaining aging state new indexes and a random forest algorithm flow are respectively shown in FIG. 1 and FIG. 2, which specifically include:

(1) a retired battery module is disassembled into retired battery cells, then the appearance, voltage and self-discharge rate of the battery are observed, and a part of the batteries are selected for direct recycling.

In some embodiments, the appearance of battery may be captured by a camera or other shooting devices, and automatically distinguished by an image processing model. The image processing model can be an existing intelligent algorithm model to identify whether a battery shell is damaged or not and exclude the battery with damage.

Certainly, in some embodiments, the batteries can also be selected manually.

In addition, it is also necessary to pick out the battery whose voltage and self-discharge rate are less than set values.

(2) Voltage and current data of the retired battery is obtained through special charging, and the voltage and current data is preprocessed to obtain an incremental capacity curve and a capacity-voltage second derivative curve. In this embodiment, the data sampling frequency is 1 Hz.

The special charging in this part refers to only charging the battery to a state that the power battery can be charged to show a first index and a second index.

In this embodiment, a working condition test specifically includes:

charging is stopped when charging to a first peak point (namely the first index) of the incremental capacity curve at ⅓ C constant current;

a battery category is determined according to whether an abscissa of the first peak is greater than a set value (3.6 V in this embodiment);

in the case of a lithium iron phosphate battery, discharging is stopped when discharging to 3.3 V, and a direct current internal resistance value at 3.3 V is recorded;

in the case of a ternary battery, discharging is stopped when continuing charging to 4.0 V, and a direct current internal resistance value at 4.0 V is recorded;

(3) features related to the battery capacity is extracted based on charging data of the battery;

the incremental capacity curve is obtained by performing derivation on the capacity-voltage curve of the battery, and a first peak of the incremental capacity curve is extracted to serve as one aging index (namely the first index) after Gaussian filtering; and a new curve is obtained by performing derivation on the incremental capacity curve, and a first peak of the new curve is extracted to serve as a new index (namely the second index) for evaluating the aging state after Gaussian filtering.

In particular, the calculation formula of the battery capacity is as follows:

$$Q = \int_{t_1}^{t_2} i(t)dt$$

In the formula: Q is the capacity of a battery obtained by an ampere-hour integral method, $t_1$ is the charging start time, $t_2$ is the charging end time, and i(t) is the current value during charging.

The calculation formula of the incremental capacity curve of the retired battery is as follows:

$$\frac{dQ(t)}{dV(t)} = \left(\frac{Q(n+j) - Q(j)}{V(n+j) - V(j)}\right)$$

In the formula: Q(t) and V(t) represent the electric quantity and terminal voltage at a time t respectively. Q(j) and V(j) are discrete versions of Q(t) and V(t) respectively. Furthermore, n is the sampling interval.

The calculation formula of a new index for evaluating the aging state is as follows:

$$\frac{d^2Q(t)}{dV(t)^2} = \left(\frac{Q'(n+j) - Q'(j)}{V(n+j) - V(j)}\right)$$

Q'(t) represents a derivative value of an electric quantity function at the time t, Q'(j) is the discrete version of Q'(t), and n is the sampling interval.

A training process of retirement screening based on a random forest algorithm includes:

voltage and current data is obtained through charging a part of different categories of retired batteries, and a real capacity value of the retired battery is obtained by using an ampere-hour integral method; and the above features are extracted by only using capacity-voltage data of a small number of charging segments, a battery category is determined through a peak coordinate position of the incremental capacity curve, and a lithium iron phosphate battery training sample set and a ternary lithium battery training sample set are respectively formed.

The two retired battery training sample sets are used for training two random forest models respectively, and the training processes of the two models are consistent, which includes:

for the convenience of description, supposing that a training set is T, which includes N samples; supposing that a feature set is F, which includes the first index and the second index; and supposing that a category set is C.

(a) N samples are extracted using a bootstrap method (i.e., with replacement) from the training set T with the capacity of N to serve as a training subset $T_k$;

(b) for the training subset $T_k$, m features are randomly extracted from the feature set F without replacement to serve as the basis for splitting each node on a decision tree, where $m=\log_2 M$ (round up to an integer) and M represents the dimension of the feature set, and a complete decision tree $D_k$ is generated from top to bottom starting from a root node without pruning; and (c) steps (a) and (b) are repeated for n times to obtain n training subsets $T_1$, $T_2$, . . . , $T_n$ decision trees $D_1$, $D_2$, . . . , $D_n$ are generated, and the n decision trees are combined to form a random forest.

Figure 3:
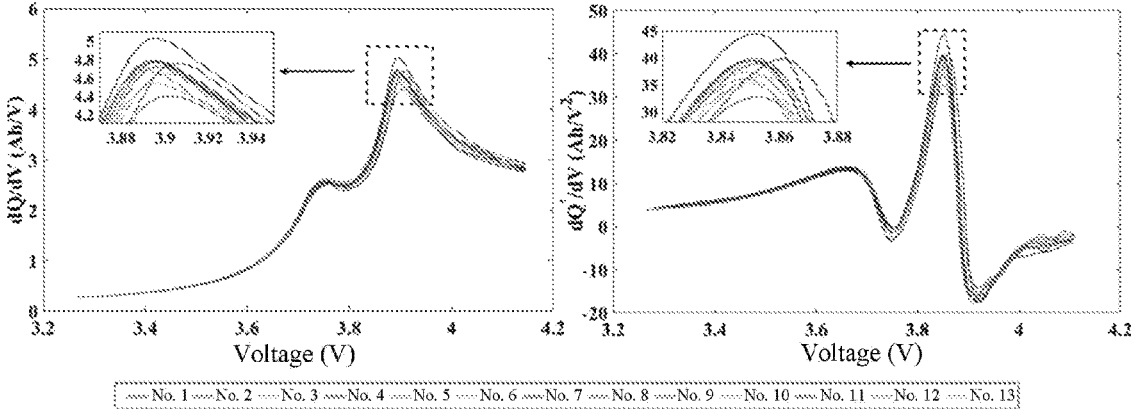
FIG. 3 is an incremental capacity curve and a capacity-voltage second derivative curve of multiple retired ternary lithium batteries.
Figure 4:
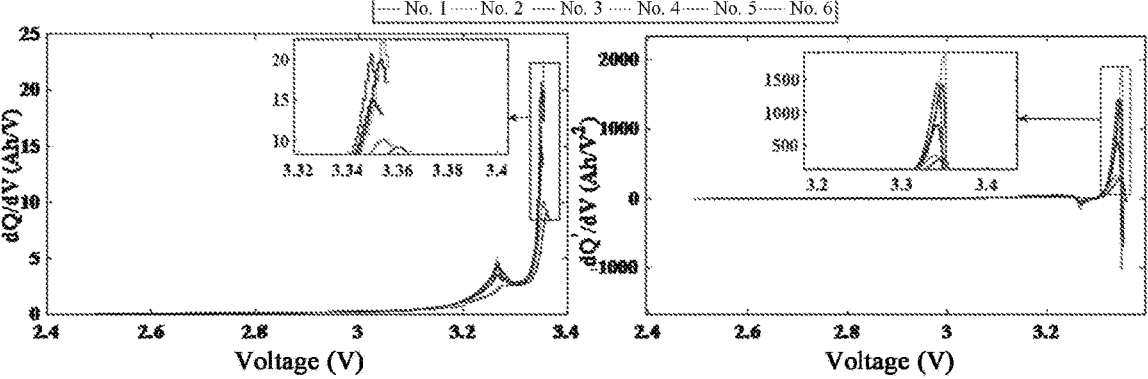
FIG. 4 is an incremental capacity curve and a capacity-voltage second derivative curve of multiple retired lithium iron phosphate batteries.

As a typical embodiment, in this embodiment, the capacity-voltage curve of the retired battery is processed twice to extract features representing the battery capacity. The extracted features include: coordinate of the first peak point of the incremental capacity curve and coordinate of the first peak point of the capacity-voltage second derivative curve. With the decreasing of the lower the capacity of the retired battery, the position of peak point moves to the lower right, as shown in FIG. 3 and FIG. 4.

By calculating a Pearson correlation coefficient between the feature and the capacity, it is shown that the correlation between the feature and the capacity is relatively strong, and the specific results are shown in Table 1. $P_1$ and $P_2$ are the peak points of two curves of the retired ternary battery respectively; and $P_3$ and $P_4$ are the peak points of two curves of the retired lithium iron phosphate battery, where $P_{i\_x}$ represents the abscissa of the peak point, and $P_{i\_y}$ represents the ordinate of the peak point, (i=1,2,3,4).

TABLE 1

| Correlation Coefficient Between Extracted Feature and Capacity | | | | | | | | |
|---|---|---|---|---|---|---|---|---|
| Feature | $P_{1\_x}$ | $P_{1\_y}$ | $P_{2\_x}$ | $P_{2\_y}$ | $P_{3\_x}$ | $P_{3\_y}$ | $P_{4\_x}$ | $P_{4\_y}$ |
| Coefficient | −0.77 | 0.89 | −0.70 | 0.87 | −0.56 | 0.84 | 0.48 | 0.77 |

In this embodiment, the capacity features of/batteries are extracted based on the incremental capacity curve and the capacity-voltage second derivative curve of the retired ternary battery to form a training set $\{(P_{1,1}, P_{1,2}, C_1), (P_{2,1}, P_{2,2}, C_2), . . . , (P_{l,1}, P_{l,2}, C_l)\}$; and capacity features $(P_{i,3}, P_{i,4}, C_i)$ of k batteries are extracted based on the incremental capacity curve and the capacity-voltage second derivative curve of the retired lithium iron phosphate battery to form a training set $\{(P_{1,3}, P_{1,4}, C_1), (P_{2,3}, P_{2,4}, C_2), . . . , (P_{k,3}, P_{k,4}, C_k)\}$.

A random forest model I is trained based on the data set of the retired lithium iron phosphate batteries, and a random forest model II is trained based on the data set of the retired ternary batteries. The random forest model is composed of a plurality of independent decision trees, and n training sample subsets obtained by bootstrap sampling are used for training the n decision trees to finally generate a random forest.

Figure 2:
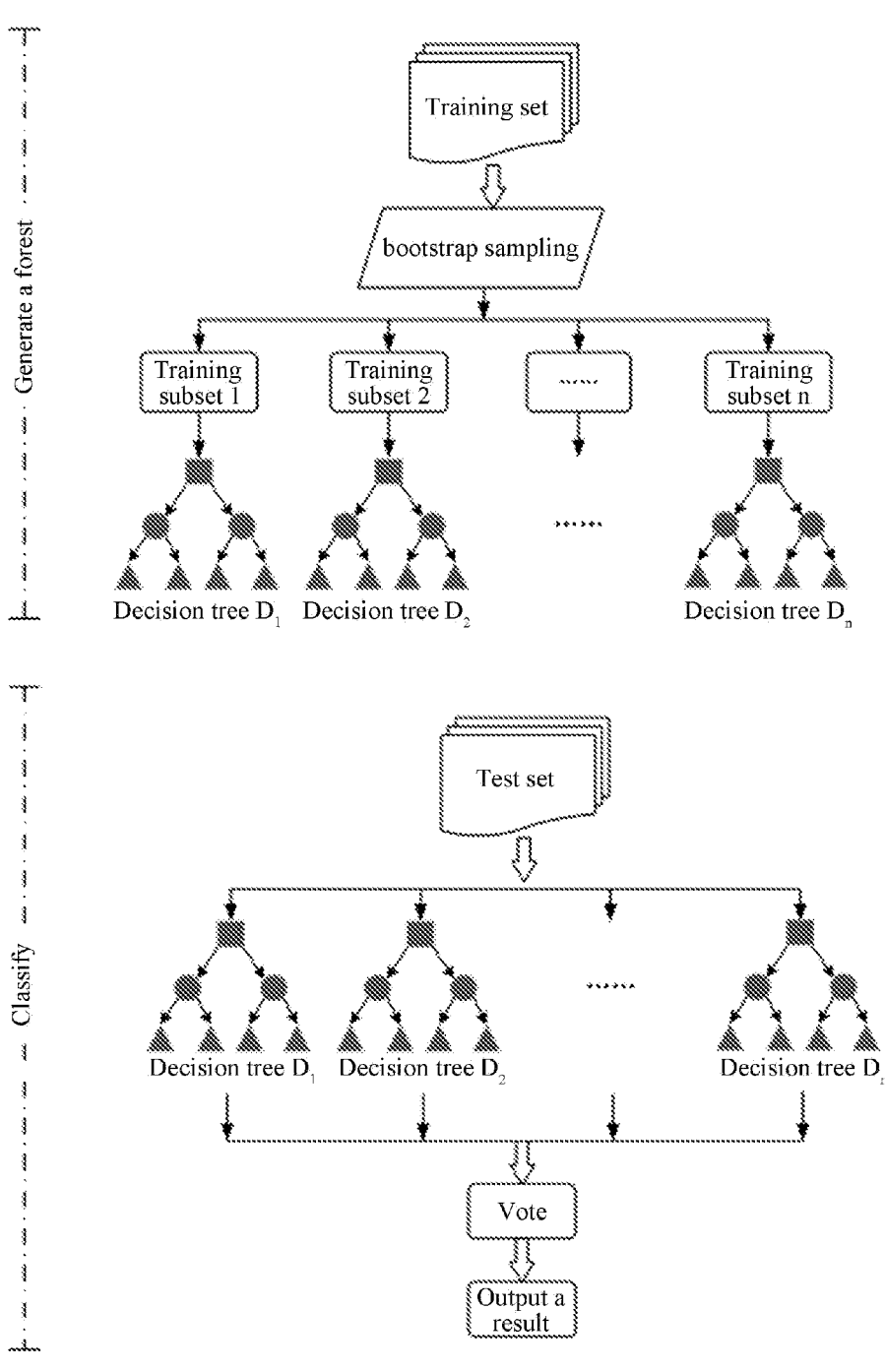
FIG. 2 is a random forest algorithm flow of a retired battery.

A test set is inputted into the well-trained retired battery screening model based on the random forest, each decision tree is enabled to make a decision on the test set, and then a majority voting method is adopted to vote on the decision results, and finally a category number of the retired battery is decided, as shown in FIG. 2. In this embodiment, an output function of the retired battery screening model based on the random forest is specifically:

$$\hat{Y} = \mathrm{argmax}_C \sum\nolimits_{j=1}^{J} F(D_j(T) = C)$$

C represents an actual category set, $D_j(T)$ is an estimation category of a jth decision tree, and $F(\cdot)$ is a 0-1 judgment function, and argmax(·) is a category number with the most outputted votes output.

In this embodiment, 222 retired lithium iron phosphate batteries and 103 retired ternary batteries are selected to form the sample sets for training and test, where the specific numbers of training set samples and test set samples are shown in Table 2 and Table 3.

TABLE 2

| Numbers of Training Samples and Test Samples of Retired Ternary Batteries. | | | |
|---|---|---|---|
| Category | 1 | 2 | 3 |
| Total Sample | 45 | 47 | 11 |
| Training Sample | 30 | 31 | 7 |
| Test Sample | 15 | 16 | 4 |

TABLE 3

| Numbers of Training Samples and Test Samples of Retired Lithium Iron Phosphate Batteries. | | | |
|---|---|---|---|
| Category | 1 | 2 | 3 |
| Total Sample | 15 | 32 | 175 |
| Training Sample | 10 | 22 | 117 |
| Test Sample | 5 | 10 | 58 |

Figure 5:
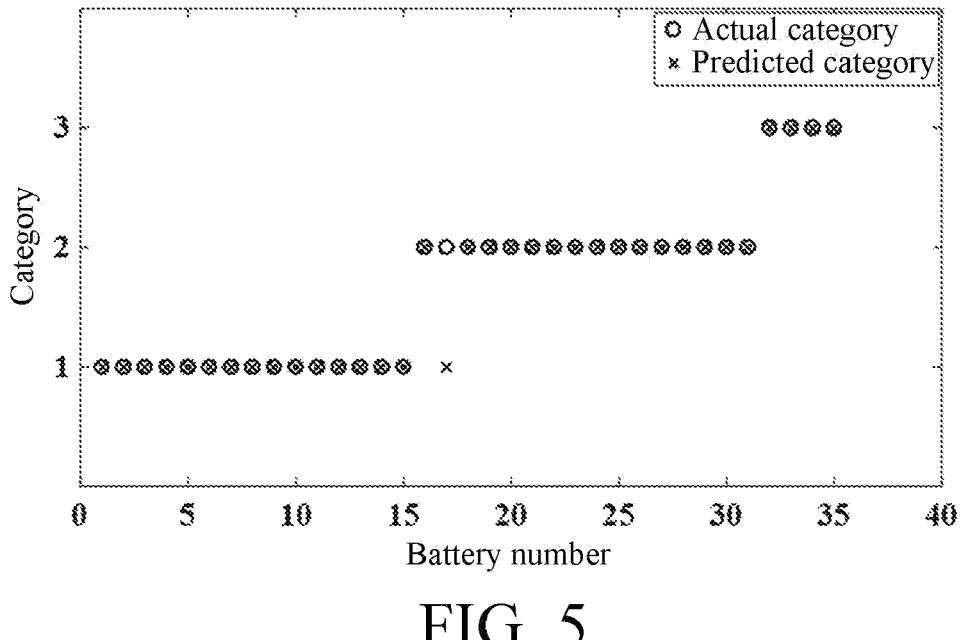
FIG. 5 is a sorting result diagram of retired ternary lithium batteries.
Figure 6:
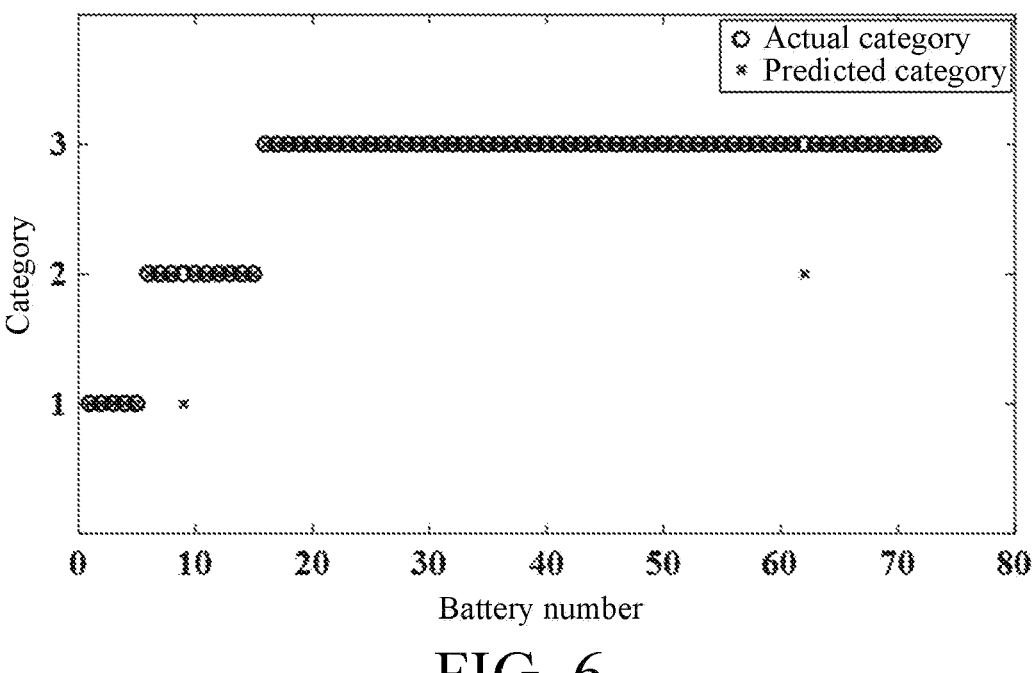
FIG. 6 is a sorting result diagram of retired lithium iron phosphate batteries.

In order to show the classification effect of the provided method, each kind of retired batteries is divided into three categories according to the capacity and intensity, and a part of the retired batteries in each category is selected for training, and the provided method is tested by comparing actual classification results with predicted classification results. The screening results of different kinds of retired batteries are shown in FIG. 5 and FIG. 6, where the classification accuracy of the test set of the retired ternary batteries is 97.14%, and the classification accuracy of the test set of the lithium iron phosphate batteries is 97.26%. The overall screening accuracy of the retired batteries reaches up to 97.22%, and only three of the 108 retired batteries are misclassified. In addition, due to small-segment charging test, the test time is greatly reduced.

An evaluation function for the test result is:

$$\alpha = \frac{\sum_{\mu=1}^{\lambda} C_\mu \odot C'_\mu}{\lambda} \times 100\%$$

$\lambda$ represents the number of the retired batteries in the test set, $$C'_\mu$$

represents a predicted classification number of a μth retired battery, and $C_\mu$ represents an actual classification number of the μth retired battery.

Based on the results of battery capacity classification, third-level screening is performed by extracting the direct current internal resistance.

The two kinds of batteries can use the direct current internal resistance at the above voltage points as the internal resistance of the whole battery. Pulse discharging is performed with 0.1 V as a voltage interval: the direct current internal resistance of the battery is measured after standing for a period of time each time discharging is reduced by 0.1 V, it is found that the direct current internal resistance of the lithium iron phosphate battery does not change significantly within a low voltage range, so that the direct current internal resistance at 3.3 V can be used as the internal resistance of the battery to reduce the test time; and as for the ternary battery, the internal resistance does not change significantly in a high-voltage area during charging, so that the direct current internal resistance at 4.0 V can be used as the internal resistance of the battery to reduce the test time.

The calculation formula of the direct current internal resistance is as follows:

$$DCR = \left| \frac{U(t_1) - U(t_1 + 1)}{I(t_1)} \right|$$

$U(t_1)$ represents the voltage value at a time $t_1$, $U(t_1+1)$ represents the voltage value at the first second of standing after the time $t_1$, and $I(t_1)$ is the current value at the time $t_1$.

Figures 7, 8:
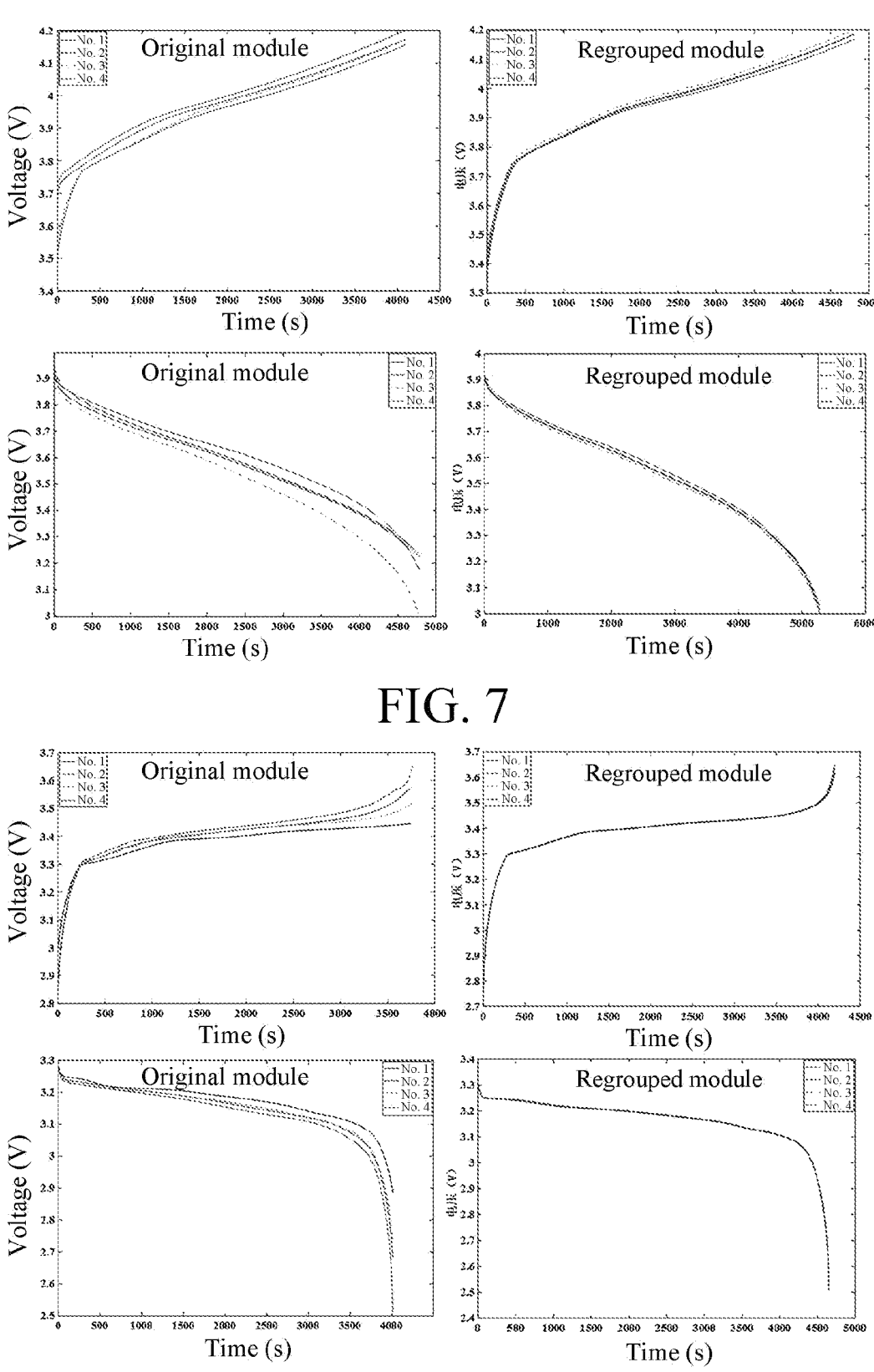
FIG. 7 is effect diagrams of charging-discharging consistency of retired ternary lithium batteries before and after regrouping.
FIG. 8 is effect diagrams of charging-discharging consistency of retired lithium iron phosphate batteries before and after regrouping.

In this embodiment, the retired ternary batteries and lithium iron phosphate batteries with similar performance are regrouped respectively, and each module is formed by connecting four battery cells in series. The voltage inconsistency between the battery cells is verified by a simple complete charging-discharging test, and the results are shown in FIG. 7 and FIG. 8. It can be seen from the figures that the consistency of the batteries after regrouping is significantly improved compared with the previous initial module.

In some embodiments, the method further includes a verification process after regrouping. The retired ternary batteries and lithium iron phosphate batteries with similar performance are respectively regrouped in series and then subjected to a normal charging-discharging test to verify the consistency of the batteries after screening and regrouping.

Embodiment 2

In one or more implementations, disclosed is a system for evaluating power battery aging state and screening retirement, which includes:

the system for evaluating power battery aging state and screening retirement includes:

a first screening module, configured to perform first-level screening according to appearance and voltage data of a power battery;

a second screening module, configured to obtain charging test data in a set time of the power battery subjected to the first-level screening, perform derivation and secondary derivation based on a capacity-voltage curve of the battery, respectively extract a first index and a second index of a set peak of the derivated curve, and respectively use the first index and the second index to determine a battery category and consistency, thereby realizing second-level screening; and a third screening module, configured to perform third-level screening on the battery subjected to the second-level screening based on a direct current internal resistance of the battery.

It should be noted that the specific implementations of the above modules have been described in Embodiment 1, and will not be described in detail here.

10

Embodiment 3

Figures 9, 10:
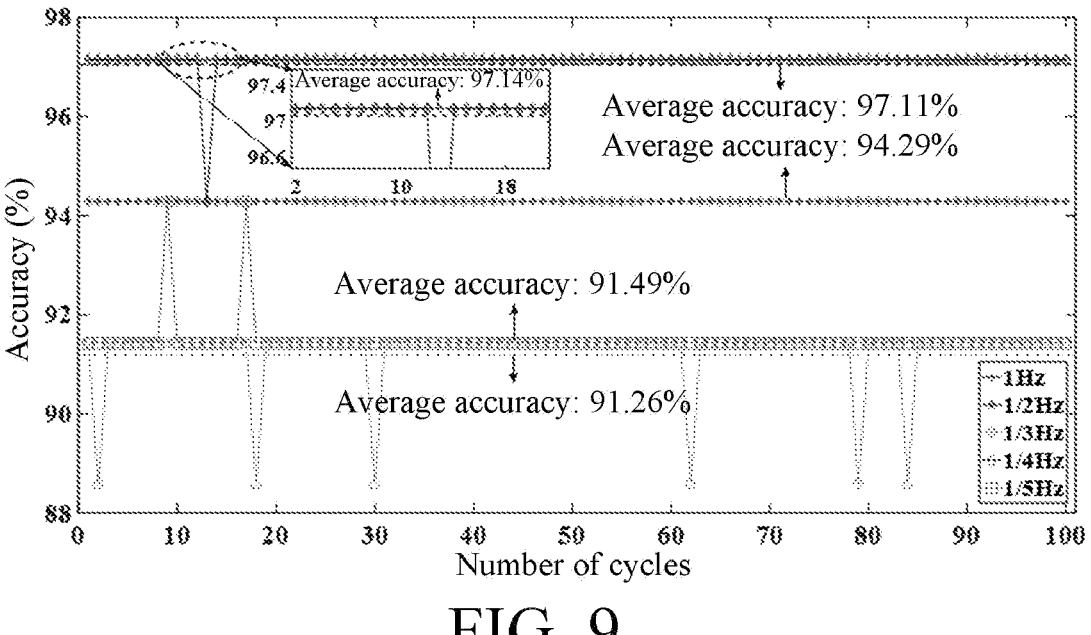
FIG. 9 is a screening accuracy diagram of retired ternary batteries at different dv intervals.
FIG. 10 is a screening accuracy diagram of retired lithium iron phosphate batteries at different dv intervals.

In one or more implementations, the incremental capacity curve and the capacity-voltage second derivative curve of the retired battery can be obtained at different voltage intervals. Although there will be certain changes in the two curves, the provided method for evaluating power battery aging state and the retirement screening technology thereof are still applicable. The screening accuracy of 100 tests of the retired batteries is shown in FIG. 9 and FIG. 10.

Embodiment 4

Figure 11:
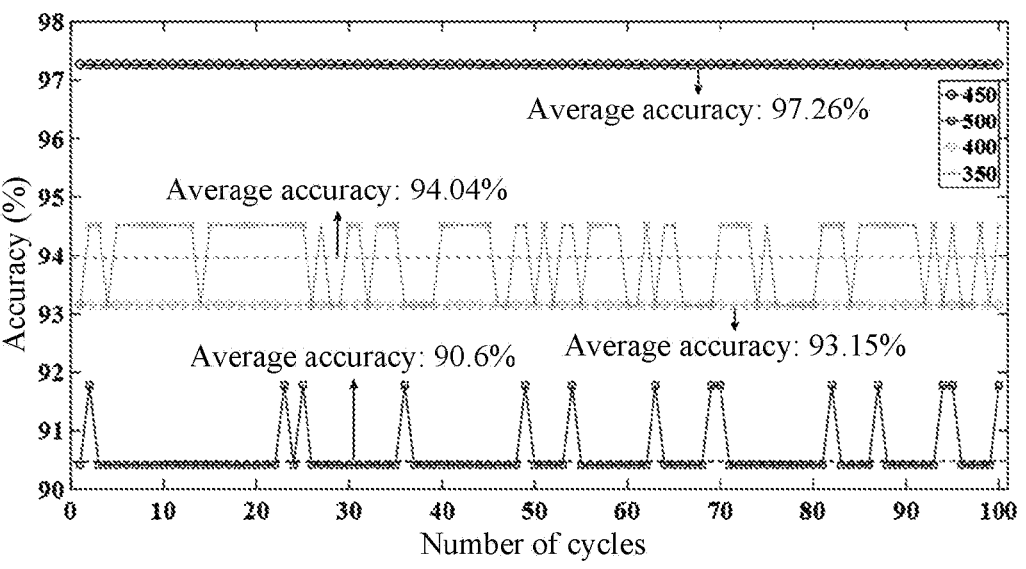
FIG. 11 is a screening accuracy diagram of retired lithium iron phosphate batteries at different sampling frequencies.
Figure 12:
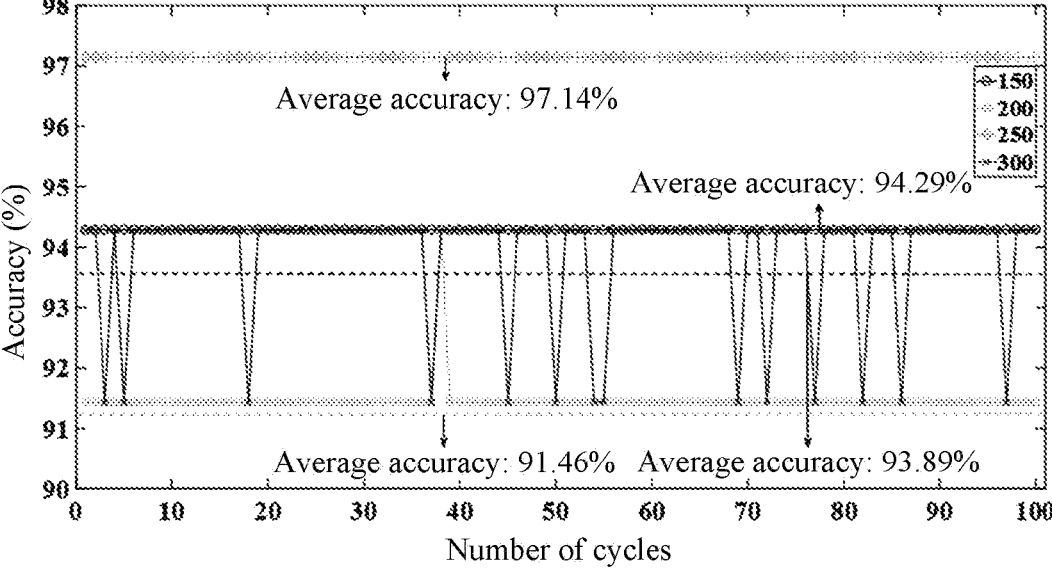
FIG. 12 is a screening accuracy diagram of retired ternary batteries at different sampling frequencies.

In one or more implementations, voltage and current data of the retired battery can be obtained at different sampling frequencies, and the provided method for evaluating power battery aging state and the retirement screening technology thereof are still applicable. The screening accuracy of 100 tests of the retired batteries is shown in FIG. 11 and FIG. 12.

A person skilled in the art should understand that the embodiments of the present invention may be provided as a method, a system, or a computer program product. Therefore, the present invention may use a form of hardware-only embodiments, software-only embodiments, or embodiments with a combination of software and hardware. Moreover, the present invention may use a form of a computer program product that is implemented on one or more computer-usable storage media (including but not limited to a disk memory, a compact disc read-only memory (CD-ROM), an optical memory, and the like) that include computer-usable program code.

The present invention is described with reference to the flowcharts and/or block diagrams of the method, the device (system), and the computer program product according to the embodiments of the present invention. It should be understood that computer program instructions can implement each procedure and/or block in the flowcharts and/or block diagrams and a combination of procedures and/or blocks in the flowcharts and/or block diagrams. These computer program instructions may be provided to a general-purpose computer, a special-purpose computer, an embedded processor, or a processor of another programmable data processing device to generate a machine, so that an apparatus configured to implement functions specified in one or more procedures in the flowcharts and/or one or more blocks in the block diagrams is generated by using instructions executed by the computer or the processor of another programmable data processing device.

These computer program instructions may alternatively be stored in a computer-readable memory that can instruct a computer or another programmable data processing device to work in a specific manner, so that the instructions stored in the computer-readable memory generate an artifact that includes an instruction apparatus. The instruction apparatus implements functions specified in one or more procedures in the flowcharts and/or one or more blocks in the block diagrams.

These computer program instructions may further be loaded onto a computer or another programmable data processing device, so that a series of operations and steps are performed on the computer or the another programmable device, thereby generating computer-implemented processing. Therefore, the instructions executed on the computer or the another programmable device provide steps for implementing functions specified in one or more procedures in the flowcharts and/or one or more blocks in the block diagrams.

The foregoing descriptions are merely preferred embodiments of the present invention, but are not intended to limit the present invention. A person skilled in the art may make various alterations and variations to the present invention. Any modification, equivalent replacement, or improvement made and the like within the spirit and principle of the present invention shall fall within the protection scope of the present invention.

The specific implementations of the present invention are described above with reference to the accompanying drawings, but are not intended to limit the protection scope of the present invention. A person skilled in the art should understand that various modifications or deformations may be made without creative efforts based on the technical solutions of the present invention, and such modifications or deformations shall fall within the protection scope of the present invention.

What is claimed is:

1. A method for evaluating power battery aging state and screening retirement, comprising:

performing a first-level screening comprising screening out, for recycling, battery cells with damaged shells as well as battery cells with a voltage and self-discharge rate less than set values, from battery cells disassembled from a retired battery module;

performing a second-level screening on battery cells subjected to the first-level screening, the second-level screening comprising:

performing a charging test on each of the battery cells for a set time period to obtain charging test data, and drawing a capacity-voltage curve for each of the battery cells, performing a primary derivation on the capacity-voltage curve to obtain a primary derivative curve and a secondary derivation on the primary derivative curve to obtain a second derivative curve, extracting a first value of a peak of the primary derivative curve as a first index and extracting a second value of a peak of the second derivative curve as a second index, dividing the battery cells into two categories based on whether the first index exceeds a first set value, and for each of the two categories, screening out battery cells having a capacity below a threshold determined based on the second index; and performing a third-level screening comprising, for each of the two categories, selecting four battery cells with consistency subjected to the second-level screening based on direct current internal resistance measurements of the batteries to form a new battery module connecting the selected four battery cells in series.

2. The method for evaluating power battery aging state and screening retirement according to claim 1, wherein the charging test data comprises data of voltage and current obtained during the charging test.

3. The method for evaluating power battery aging state and screening retirement according to claim 1, wherein the set time is greater than or equal to the time required for the battery cells subjected to the first-level screening to be charged to show the first index and the second index.

4. The method for evaluating power battery aging state and screening retirement according to claim 1, wherein the primary derivation comprises deriving the capacity-voltage curve to obtain the primary derivative curve, performing Gaussian filtering on the primary derivative curve, and extracting a coordinate of a first peak of the filtered primary derivative curve as the first index; and the second derivation comprises deriving the primary derivative curve to obtain the secondary derivative curve, performing Gaussian filtering on the secondary derivative curve, and extracting a coordinate of a first peak of the filtered secondary derivative curve as the second index, determining consistency of each of the battery cells subjected to the first-level screening in each category of the two categories by using the second index, and screening out the battery cells in each of the two categories with the capacity less than the threshold determined based on the second index.

5. The method for evaluating power battery aging state and screening retirement according to claim 4, wherein if an abscissa value of the coordinate of the first index is greater than the first set value, the battery cell is a ternary lithium battery, otherwise the battery cell is a lithium iron phosphate battery.

6. The method for evaluating power battery aging state and screening retirement according to claim 4, further comprising using at least one trained random forest model to perform the determination of the capacity of each of the battery cells subjected to the first-level screening in each of the two categories according to the second index.

7. The method for evaluating power battery aging state and screening retirement according to claim 6, wherein a training process of the random forest model comprises:

obtaining voltage and current data through charging a part of different categories of battery cells subjected to the first-level screening, and obtaining a real capacity value of each of the battery cells subjected to the first-level screening by using an ampere-hour integral method;

extracting the first index and second index by using capacity-voltage data of a part of charging segments, determining the battery category through a coordinate position of the first index, forming different battery training sample sets respectively, and extracting a plurality of samples with replacement to serve as a training subset; and for the training subset, randomly extracting a plurality of features from a feature set without replacement to serve as the basis for splitting each node on a decision tree, generating a complete decision tree from top to bottom starting from a root node, repeating the process until a plurality of decision trees are obtained, and combining the decision trees to form the random forest model.

8. The method for evaluating power battery aging state and screening retirement according to claim 1, wherein a process of obtaining the direct current internal resistance of the battery comprises: for a lithium iron phosphate battery, after a charging task, discharging the lithium iron phosphate battery to a first set voltage and then standing for a period of time, and calculating the direct current internal resistance of the lithium iron phosphate battery according to the first set voltage and the voltage value after standing; and for a ternary battery, after obtaining a capacity feature, continuously charging the ternary battery to a second set voltage and then standing for a period of time, and calculating the direct current internal resistance of the ternary battery according to the second set voltage and the voltage value after standing.

9. The method for evaluating power battery aging state and screening retirement according to claim 8, wherein for each battery cell, a direct current internal resistance measured at a set voltage point is used as the internal resistance of the respective battery cell.

* * * * *